（12） United States Patent
Mouli et al.

(10) Patent No.: US 8,847,195 B2
(45) Date of Patent: Sep. 30, 2014

(54) STRUCTURES FOR RESISTANCE RANDOM ACCESS MEMORY AND METHODS OF FORMING THE SAME

(75) Inventors: Chandra Mouli, Boise, ID (US); Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 831 days.

(21) Appl. No.: 12/647,020

(22) Filed: Dec. 24, 2009

(65) Prior Publication Data

US 2011/0155994 A1 Jun. 30, 2011

(51) Int. Cl.
*H01L 45/00* (2006.01)
*H01L 27/24* (2006.01)

(52) U.S. Cl.
CPC .............. *H01L 45/10* (2013.01); *H01L 45/144* (2013.01); *H01L 45/1233* (2013.01); *H01L 45/1683* (2013.01); *H01L 45/1675* (2013.01); *H01L 27/2481* (2013.01); *H01L 45/148* (2013.01)
USPC . 257/5; 257/2; 257/3; 257/296; 257/E45.001; 257/E45.002; 438/400; 438/482

(58) Field of Classification Search
USPC ............. 257/2, 5, E45.002, E27.009, E21.09; 438/482
See application file for complete search history.

(56) References Cited

U.S. PATENT DOCUMENTS

| 4,433,342 | A | 2/1984 | Patel et al. | |
|---|---|---|---|---|
| 7,060,586 | B2 | 6/2006 | Li et al. | |
| 8,339,834 | B2 * | 12/2012 | Nakai et al. | 365/148 |
| 8,441,062 | B2 * | 5/2013 | Cho et al. | 257/324 |
| 2003/0235073 | A1 * | 12/2003 | Fricke et al. | 365/163 |
| 2006/0175596 | A1 * | 8/2006 | Happ et al. | 257/2 |
| 2006/0246270 | A1 | 11/2006 | Takada et al. | |
| 2007/0064468 | A1 * | 3/2007 | Seol et al. | 365/129 |
| 2007/0269683 | A1 | 11/2007 | Chen et al. | |
| 2008/0105861 | A1 * | 5/2008 | Hosaka et al. | 257/4 |
| 2008/0116440 | A1 | 5/2008 | Ho et al. | |
| 2008/0164504 | A1 * | 7/2008 | Chen et al. | 257/296 |
| 2008/0246078 | A1 * | 10/2008 | Huo et al. | 257/324 |
| 2009/0003034 | A1 * | 1/2009 | Happ et al. | 365/148 |
| 2009/0014707 | A1 | 1/2009 | Lu et al. | |
| 2009/0081825 | A1 * | 3/2009 | Chen | 438/102 |
| 2009/0095985 | A1 | 4/2009 | Lee et al. | |
| 2010/0323491 | A1 * | 12/2010 | Moniwa et al. | 438/381 |
| 2011/0205781 | A1 * | 8/2011 | Nakai et al. | 365/148 |

OTHER PUBLICATIONS

Chen et al., "An Access-Transistor-Free (0T/1R) Non-Volatile Resistance Random access Memory (RRAM) Using a Novel Threshold Switching, Self-Rectifying Chalcogenide Device," *IEEE International Electron Devices Meeting 2003*.

Linder et al., "Growth and Scaling of Oxide Conduction after Breakdown," *IEEE 2003*, pp. 402-405.

(Continued)

*Primary Examiner* — Minh-Loan T Tran
*Assistant Examiner* — Fazli Erdem
(74) *Attorney, Agent, or Firm* — Dickstein Shapiro LLP (57) ABSTRACT

Memory cells and methods of forming the same and devices including the same. The memory cells have first and second electrodes. An amorphous semiconductor material capable of electronic switching and having a first band gap is between the first and second electrodes. A material is in contact with the semiconductor material and having a second band gap, the second band gap greater than the first band gap.

55 Claims, 9 Drawing Sheets

(56) References Cited

OTHER PUBLICATIONS

Pirovano et al., "Low-Field Amorphous State Resistance and Threshold Voltage Drive in Chalcogenide Materials," *IEEE Transactions of Electron Devices*, vol. 51, No. 5, May 2004.

Redaelli et al., "Electronic Switching Effect and Phase-Change Transition in Chalcogenide Materials," *IEEE Electron Device Letters*, vol. 25, No. 10, Oct. 2004, pp. 684-686.

Robertson et al., "Band offsets of high K gate oxides on III-V semiconductors," *Journal of Applied Physics* 100, 014111, 2006, pp. 014111-2 to 014111-8.

* cited by examiner

STRUCTURES FOR RESISTANCE RANDOM ACCESS MEMORY AND METHODS OF FORMING THE SAME

FIELD OF THE INVENTION

Embodiments of the invention relate to semiconductor devices and, in particular, to programmable resistance memory elements and methods of forming and using the same.

BACKGROUND OF THE INVENTION

An access-transistor-free (0T/1R) non-volatile resistance random access memory (RRAM) having a cross point architecture has been described by Yi-Chou Chen et al., "An Access-Transistor-Free (0T/1R) Non-Volatile Resistance Random Access Memory (RRAM) Using a Novel Threshold Switching, Self-Rectifying Chalcogenide Device," IEEE International Electron Devices Meeting 2003. The described prior art device 10 shown in FIG. 1A includes a cross point array with the bit lines 20 and word lines 21 arranged perpendicularly. Each memory cell 11 has a top electrode 12 and bottom electrode 13 (TiW) and a chalcogenide layer 14 ($Ge_2Sb_2Te_5$) therebetween. The operation of the device 10 requires that the chalcogenide layer 14 remain amorphous.

During operation of the device 10, memory is retained via the modulation of the electronic switching threshold voltage. Any semiconductor layer that experiences a field-assisted carrier-concentration dependent generation mechanism and a competitive tarp-assisted carrier recombination will show electronic switching. The threshold voltage is the point at which the generation rate exceeds the recombination rate. At this point, the amorphous material experiences snapback, and the resistance falls, as shown in FIG. 1B. The modulation of this phenomenon is critical to the device's 10 operation.

The threshold voltage for electronic switching can be modulated by controlling the occupancy state of recombination centers. It has been shown that the threshold voltage of a recently amorphized germanium-antimony-tellurium (GST) material increases in time. Agostino Pirovano, et al., "Low-Field Amorphous State Resistance and Threshold Voltage Drift in Chalcogenide Materials," IEEE Transactions of Electron Devices, vol. 51, no. 5, May 2004. This can be explained by empty acceptor-like traps that exist immediately after the material becomes amorphous. Over time, the traps fill, resulting in an increased Fermi level.

The threshold voltage of the device 10 is changed by applying differing electronic potentials to modulate the trap states. To create a low threshold voltage, a lower bias that is greater than the threshold voltage is applied to the chalcogenide layer 14. Since the bias exceeds the threshold voltage, the generation rate exceeds the recombination rate and free carriers exist for conduction. At the same time, the acceptor-like traps empty as the holes tunnel out of the traps. Since it takes time for the traps to fill with holes, excess holes exist for conduction. While the traps remain empty, the threshold voltage remains low.

To increase the threshold voltage, the applied bias is increased resulting in filled traps. If a bias is applied that exceeds the bias used for creating the low threshold voltage, a higher electric field in the chalcogenide layer 14 will result. This field will allow for trap-assisted tunneling. The "hole" occupying the acceptor-like trap will tunnel out since its barrier will have been reduced by the high electric field. This creates a higher threshold voltage.

Figure 1A:
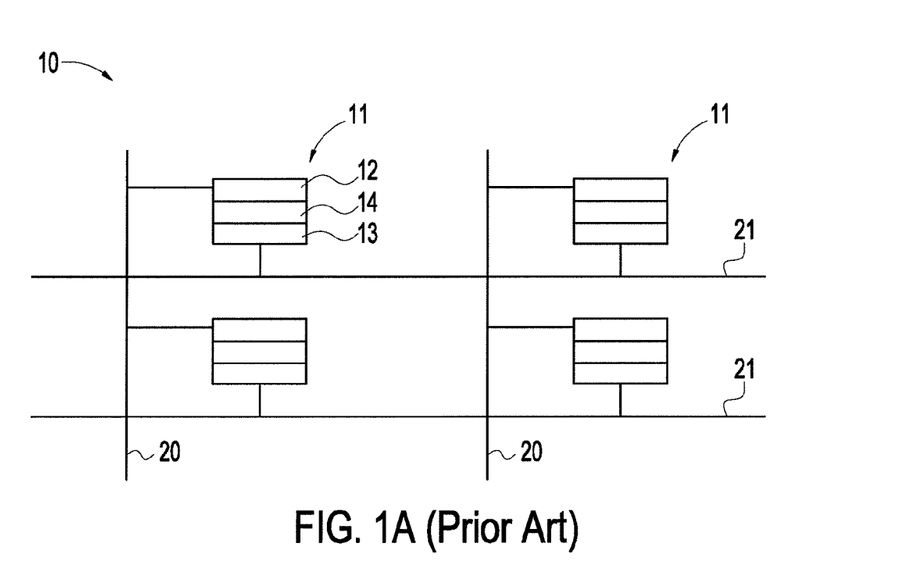
FIG. 1A is a diagram of a prior art memory device.
Figure 1B:
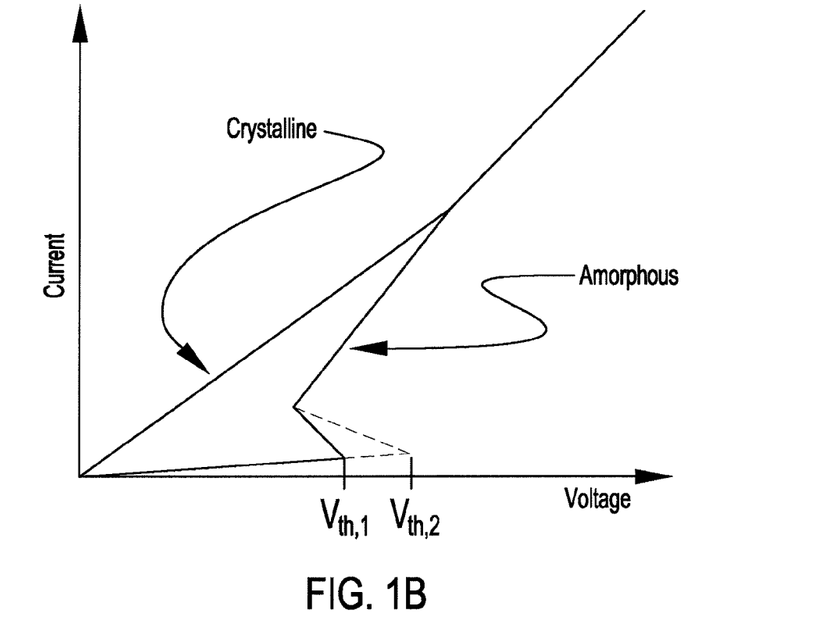
FIG. 1B is a graph showing the current-voltage cures of a semiconductor material that exhibits electronic switching.

There are two significant problems with the FIG. 1A device 10: 1) the need for an amorphous material and 2) poor data retention. Since the modulation of the threshold voltage relies upon electronic switching of an amorphous material, it is critical that the material remain amorphous. If the chalcogenide layer 14 crystallizes there will be no electronic switching effect. Since many chalcogenide materials will crystallize at temperatures below what devices are subjected to during manufacturing processes it is a problem to keep the materials amorphous. For example, many chalcogenide materials will crystallize at temperatures below about 265° C., which is the surface mount technology reflow oven peak temperature, an oven used in the manufacture of memory devices. In addition, the device 10 shows a data retention of only 5000 seconds at room temperature.

It would be desirable to have an access-transistor-free memory device that could be subjected to higher temperatures and has improved data retention.

DETAILED DESCRIPTION OF THE INVENTION

In the following detailed description, reference is made to various embodiments of the invention. These embodiments are described with sufficient detail to enable those skilled in the art to practice them. It is to be understood that other embodiments may be employed, and that various structural, logical and electrical changes may be made. Embodiments of the disclosure are now explained with reference to the figures. Throughout the figures, like reference numbers indicate like features. For purposes of clarity, the character "'" is used to indicate a second like feature, with additional such characters indicating additional like features.

The embodiments described herein relate to memory cell structures for a resistance random access memory (RRAM). Memory cells include first and second electrodes, and a heterogeneous structure including an electronic switching semiconductor material having a first band gap and another material having a second band gap that is higher than the first band gap. FIGS. 2A-2F depict memory cell 300 structures according to various embodiments.

Figure 2A:
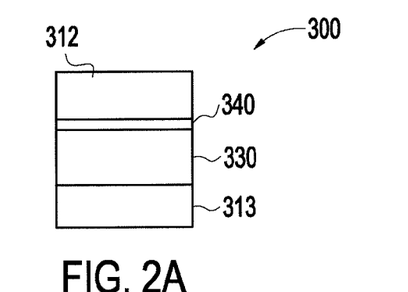
FIG. 2A is a block diagram of a memory cell according to an embodiment.

FIG. 2A depicts a memory cell 300 according to an embodiment. The memory cell 300 includes a first electrode 313 and a second electrode 312. Between the first and second electrodes 313, 312 is an amorphous, electronic switching semiconductor material 330. Between the semiconductor material 330 and the second electrode is a material 340, which has a higher band gap than the band gap of the semiconductor material 330. In one embodiment, the material 340 is a dielectric material.

The semiconductor material 330 and the material 340 are selected such that the band offset between the semiconductor material 330 and the material 340 is approximately symmetric, i.e., the conduction band and valence band offsets are approximately equal. However, since hole mobility is significantly greater than that of electrons, it is more important to create acceptor-like traps and to select materials with a high valence band offset rather than conduction band offset. As is well known in the art, an acceptor-like trap is a trap that is neutral when filled by an excess hole and carries a negative charge when it is empty, i.e., when it has given up the excess hole. The material 340 is thin enough to allow for tunneling without rupturing.

By this structure, any traps between the electronic switching semiconductor material 330 and material 340 will have a greater lifetime as compared to those within the chalcogenide layer 14 of the FIG. 1A device 10. Due to the greater lifetime of the traps at the interface of material 340 and material 330, the data retention time of the memory cell 300 will be greater than that of the memory cells 11 of device 10.

In addition, the electronic switching semiconductor material 330 should be amorphous during operation of the cell 300. It is known that certain electronic switching semiconductor materials have a low crystallization temperature. For example, GST has a crystallization temperature of about 150° C. Current technologies for forming RRAM memory devices use temperatures higher than the crystallization temperatures of certain electronic switching semiconductor materials. For example, current surface mount technology (SMT) reflow ovens use temperatures as high as 265° C., and many packaging process steps, such as encapsulation, also exceed the crystallization temperatures. Therefore, if the semiconductor material 330 has a lower crystallization temperature than the temperatures that the material 330 will be exposed to during various processing steps, the material 330 will crystallize, rather than remaining amorphous.

Figure 5A:
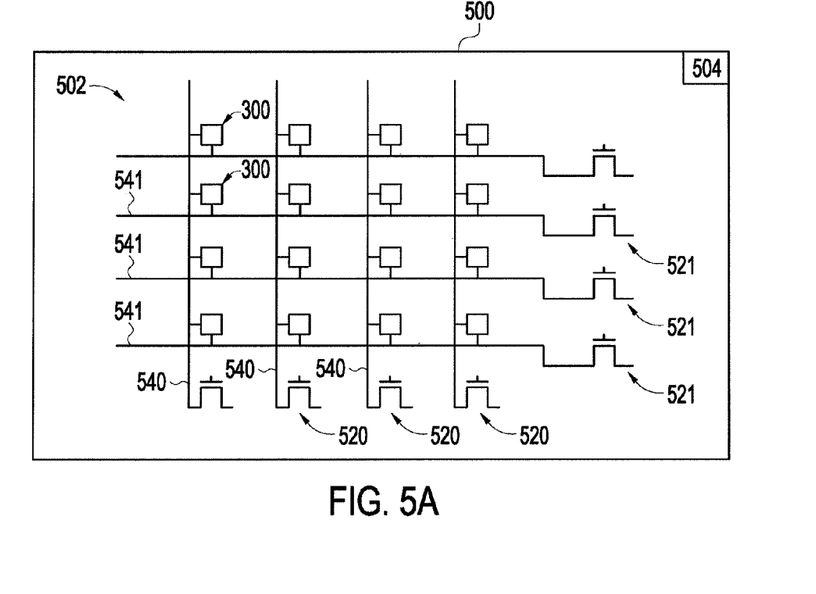
FIG. 5A is a schematic diagram of a memory device according to an embodiment.

To address this situation, it is possible to make the material 330 amorphous after it is subjected to high temperature processing steps. For this, circuitry is provided to reset the material 330 to an amorphous state. For example, where memory cell 300 is included in a memory device 500 (FIG. 5), the memory device 500 can include circuitry 504 for supplying a current to the memory cell 300 and material 330 to reset the material 330 to an amorphous state.

Alternatively, the material 330 is selected to have a crystallization temperature greater than the temperatures used during various processing steps that the material 330 is to be exposed to.

In one embodiment, at least one portion of the electronic switching semiconductor material 330 is gallium antimide (GaSb). In one embodiment the material 340 is a dielectric material, such as silicon dioxide.

GaSb has a crystallization temperature of about 350° C. and exhibits electronic switching. Further, the band gap of GaSb is about 0.75 eV$^3$. Also, the conduction band offset between GaSb and silicon dioxide is about 3.25 eV, which suggests a reasonably symmetric offset with sufficient valence band offset.

Alternatively, material 330 can be a chalcogenide material, such as GST, gallium-antimony-tin, gallium-antimony-tin-germanium, germanium-tellurium, among others. Material 340 can be a dielectric material, such as a high dielectric constant material, an oxide (e.g., silicon dioxide), among others.

In one embodiment the thicknesses of the material 340 is between about 0.5 nm and about 2 nm, and may be 1 nm. In one embodiment, the thickness of the semiconductor material 330 is between about 10 nm and about 100 nm, and may be 50 nm.

Figure 2B:
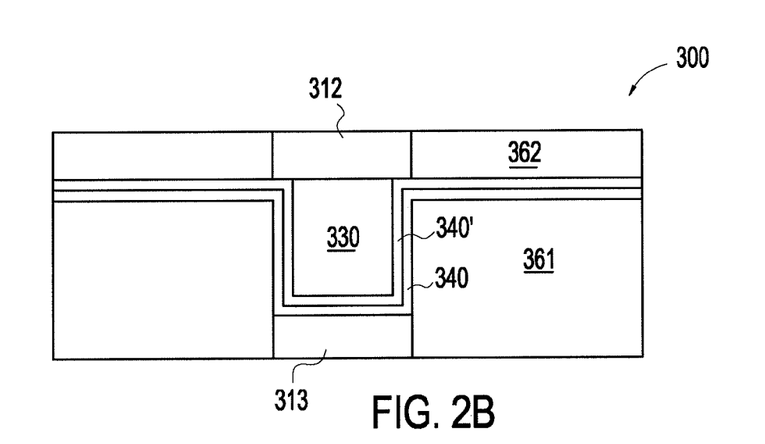
FIG. 2B is a block diagram of a memory cell according to an embodiment.

The embodiment illustrated in FIG. 2B is similar to the embodiment depicted in FIG. 2A. As shown in FIG. 2B, the memory cell 300 includes a first electrode 313 and a second electrode 312. The first electrode 313 is formed within a first dielectric material 361. The second electrode 312 is formed within a second dielectric material 362. A first layer of material 340 is within an opening of the first dielectric material 361 and on the top surface of the first dielectric material 361. Optionally, a second layer of material 340' is over the first layer of material 340. Between the second layer of material 340' and the second electrode (and within the opening in the first dielectric material 361) is an amorphous, electronic switching semiconductor material 330.

In one embodiment material 330 is GaSb. Alternatively, material 330 can be a chalcogenide material, such as GST, gallium-antimony-tin, gallium-antimony-tin-germanium, germanium-tellurium, among others. Materials 340, 340' can be a dielectric material, such as a high dielectric constant material, an oxide (e.g., silicon dioxide), among others.

In one embodiment the thicknesses of the materials 340, 340' are between about 0.5 nm and about 2 nm, and may be 1 nm. In one embodiment, the thickness of the semiconductor material 330 is between about 10 nm and about 100 nm, and may be 50 nm.

FIGS. 2C-2G depict additional embodiments of a memory cell 300. According to the embodiment depicted in FIG. 2C, the memory cell 300 includes first electrode 313 and second electrode 312. Between the first and second electrodes 313, 312 are first and second amorphous, electronic switching semiconductor materials 330, 330'. Between the first and second semiconductor materials 330, 330' is a heterogeneous structure 360 including additional amorphous electronic switching semiconductor materials 350 having a first band gap and materials 340 having a second band gap that is higher than the first band gap. In the FIG. 2C embodiment, the heterogeneous structure 360 includes five portions of the material 340 and four portions of the semiconductor material 350 arranged in an alternating layers. Additional or fewer portions of the materials 340, 350 could be included.

Figure 2C:
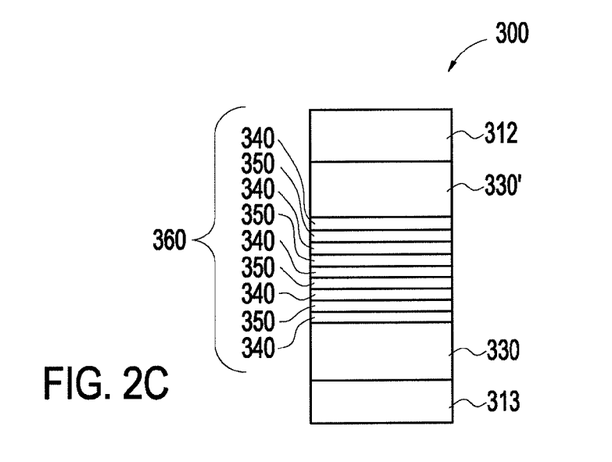
FIG. 2C is a block diagram of a memory cell according to an embodiment.

The thickness of the semiconductor materials 330, 330' are greater than the thicknesses of the portions of semiconductor material 350 within the heterogeneous structure 360. Each portion of the materials 340, 350 within the heterogeneous structure 360, should have a thickness such that there is no sharp conduction band offset at the interface of the materials 340, 350. The heterogeneous structure 360 is engineered such that, within the electronic switching semiconductor material 350, the band gap will approach the band gap of the portions of electronic switching semiconductor material 330, 330'. The band gap will increase from the electronic switching semiconductor material 350 into the material 340 due to the increase in the conduction band. The material 340 remains thin enough to allow for tunneling without rupturing.

In one embodiment the thicknesses of the portions of semiconductor material 350 and material 340 are between about 0.5 nm and about 2 nm, and may be 1 nm. In one embodiment, the thicknesses of the semiconductor materials 330, 330' are between about 10 nm and about 100 nm, and may be 50 nm.

Each of the semiconductor materials 330, 330', 350 can have same stoichiometric and/or atomic compositions or different stoichiometric and/or atomic compositions. In one embodiment, at least one of the electronic switching semiconductor materials 330, 330', 350 is GaSb. In another embodiment, each of the electronic switching semiconductor materials 330, 330', 350 is GaSb. In another embodiment, each portion of the electronic switching semiconductor material 330 is GaSb. In one embodiment the material 340 is silicon dioxide.

Alternatively, one or more of materials 330, 330', 350 can be a chalcogenide material, such as GST, gallium-antimony-tin, gallium-antimony-tin-germanium, germanium-tellurium, among others. Material 340 can be a dielectric material, such as a high dielectric constant material, an oxide (e.g., silicon dioxide), among others.

Figure 2D:
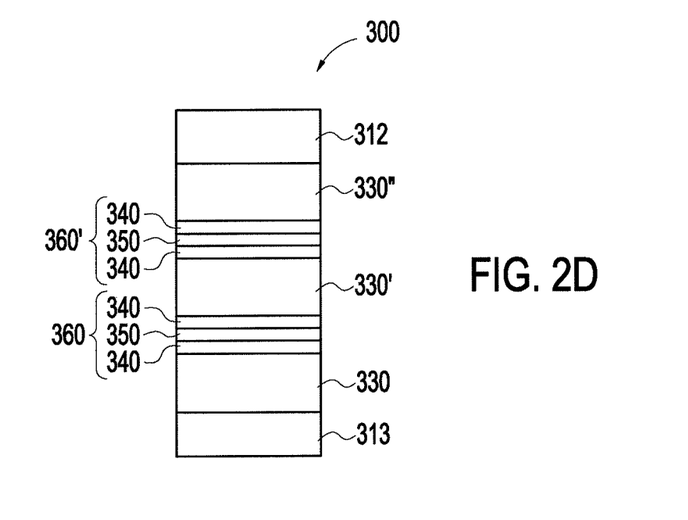
FIG. 2D is a block diagram of a memory cell according to an embodiment.

FIG. 2D depicts a memory cell 300 according to another embodiment. The memory cell 300 includes first electrode 313 and second electrode 312. Between the first and second electrodes 313, 312 are first, second and third semiconductor materials 330, 330', 330". Between the first and second semiconductor materials 330, 330' is a first heterogeneous structure 360 including semiconductor material 350 and another material 340. Between the second and third semiconductor materials 330', 330" is a second heterogeneous structure 360'. In the FIG. 2D embodiment, each heterogeneous structure 360, 360' includes one portion of the semiconductor material 350 arranged between two portions of the material 340. Additional portions of the materials 340, 350 could be included in one or both of the heterogeneous structures 360, 360'.

In one embodiment the thicknesses of the portions of semiconductor material 350 and material 340 are between about 0.5 nm and about 2 nm, and may be 1 nm. In one embodiment, the thicknesses of the semiconductor materials 330, 330', 330" are between about 10 nm and about 100 nm, and may be 50 nm.

Each of the semiconductor materials 330, 330', 330", 350 can have same stoichiometric and/or atomic compositions or different stoichiometric and/or atomic compositions. In one embodiment, at least one of the electronic switching semiconductor materials 330, 330', 330", 350 is GaSb. In another embodiment, each of the electronic switching semiconductor materials 330, 330', 330", 350 is GaSb. In one embodiment the material 340 is silicon dioxide.

Alternatively, one or more of materials 330, 330', 330", 350 can be a chalcogenide material, such as GST, gallium-antimony-tin, gallium-antimony-tin-germanium, germanium-tellurium, among others. Material 340 can be a dielectric material, such as a high dielectric constant material, an oxide (e.g., silicon dioxide), among others.

Figure 2E:
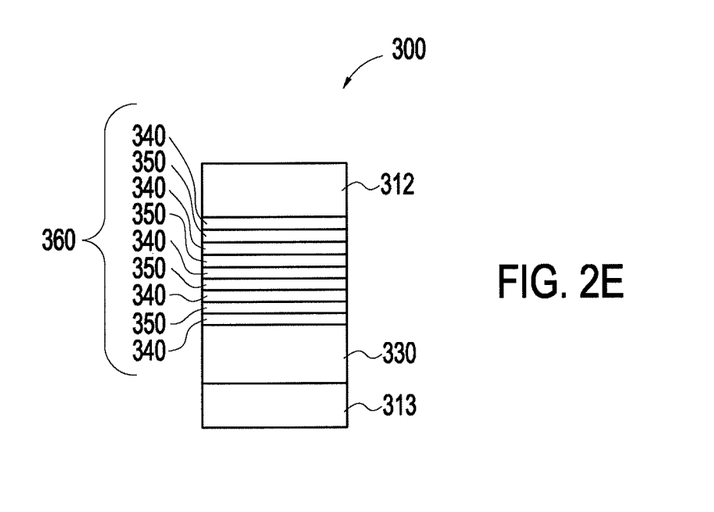
FIG. 2E is a block diagram of a memory cell according to an embodiment.

FIG. 2E depicts a memory cell 300 according to another embodiment. The memory cell 300 includes first electrode 313 and second electrode 312. Between the first and second electrodes 313, 312 is an electronic switching semiconductor material 330. Between the electronic switching semiconductor material 330 and the second electrode 312 is a heterogeneous structure 360 including an electronic switching semiconductor material 350 having a first band gap and another material 340 having a second band gap that is higher than the first band gap. In the FIG. 2E embodiment, there are five portions of the material 340 and four portions of the semiconductor material 350 arranged in an alternating layers within the heterogeneous structure 360. Additional or fewer portions of the materials 340, 350 could be included.

In one embodiment the thicknesses of the portions of semiconductor material 350 and material 340 are between about 0.5 nm and about 2 nm, and may be 1 nm. In one embodiment, the thickness of the semiconductor materials 330 is between about 10 nm and about 100 nm, and may be 50 nm.

Each of the semiconductor materials 330, 350 can have same stoichiometric and/or atomic compositions or different stoichiometric and/or atomic compositions. In one embodiment, at least one of the electronic switching semiconductor materials 330, 350 is GaSb. In another embodiment, each of the electronic switching semiconductor materials 330, 350 is GaSb. In one embodiment the material 340 is silicon dioxide.

Alternatively, one or more of materials 330, 350 can be a chalcogenide material, such as GST, gallium-antimony-tin, gallium-antimony-tin-germanium, germanium-tellurium, among others. Material 340 can be a dielectric material, such as a high dielectric constant material, an oxide (e.g., silicon dioxide), among others.

Figure 2F:
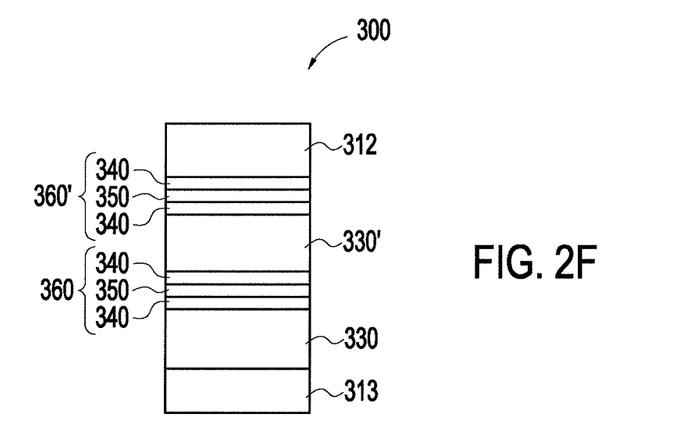
FIG. 2F is a block diagram of a memory cell according to an embodiment.

FIG. 2F depicts a memory cell 300 according to another embodiment. As shown in FIG. 2F, the memory cell 300 includes first electrode 313 and second electrode 312. Between the first and second electrodes 313, 312 are first and second semiconductor materials 330, 330'. Between the first and second semiconductor materials 330, 330' is a first heterogeneous structure 360 including semiconductor material 350 and material 340. Between the second semiconductor material 330' and the second electrode 312 is a second heterogeneous structure 360'. In the FIG. 2F embodiment, each heterogeneous structure 360, 360' includes one portion of the semiconductor material 350 arranged between two portions of the material 340. Additional portions of the materials 340, 350 could be included in one or both of the heterogeneous structures 360, 360'.

In one embodiment the thicknesses of the portions of semiconductor material 350 and material 340 are between about 0.5 nm and about 2 nm, and may be 1 nm. In one embodiment, the thicknesses of the semiconductor materials 330, 330' are between about 10 nm and about 100 nm, and may be 50 nm.

Each of the semiconductor materials 330, 330', 350 can have same stoichiometric and/or atomic compositions or different stoichiometric and/or atomic compositions. In one embodiment, at least one of the electronic switching semiconductor materials 330, 330', 350 is GaSb. In another embodiment, each of the electronic switching semiconductor materials 330, 330' 350 is GaSb. In one embodiment the material 340 is silicon dioxide.

Alternatively, one or more of materials 330, 330', 350 can be a chalcogenide material, such as GST, gallium-antimony-tin, gallium-antimony-tin-germanium, germanium-tellurium, among others. Material 340 can be a dielectric material, such as a high dielectric constant material, an oxide (e.g., silicon dioxide), among others.

Figure 2G:
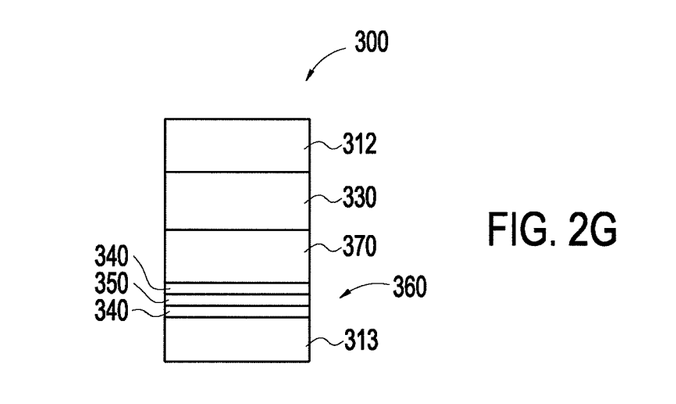
FIG. 2G is a block diagram of a memory cell according to an embodiment.

According to the embodiment depicted in FIG. 2G, the memory cell 300 includes first electrode 313 and second electrode 312. Between the first and second electrodes 313, 312 is an amorphous, electronic switching semiconductor material 330. Between the semiconductor material 330 and first electrode 313 is a heterogeneous structure 360 including an additional amorphous electronic switching semiconductor material 350 having a first band gap and materials 340 having a second band gap that is higher than the first band gap. Also, between the heterogeneous structure 360 and the semiconductor material 330 is a third, middle electrode 370. In the FIG. 2G embodiment, the heterogeneous structure 360 includes two portions of the material 340 and one portion of the semiconductor material 350 arranged in an alternating layers. Additional or fewer portions of the materials 340, 350 could be included.

The thickness of the semiconductor material 330 is greater than the thicknesses of the portions of semiconductor material 350 within the heterogeneous structure 360. Each portion of the materials 340, 350 within the heterogeneous structure 360, should have a thickness such that there is no sharp conduction band offset at the interface of the materials 340, 350. The heterogeneous structure 360 is engineered such that, within the electronic switching semiconductor material 350, the band gap will approach the band gap of the portions of electronic switching semiconductor material 330. The band gap will increase from the electronic switching semiconductor material 350 into the material 340 due to the increase in the conduction band. The material 340 remains thin enough to allow for tunneling without rupturing.

In one embodiment the thicknesses of the portions of semiconductor material 350 and material 340 are between about 0.5 nm and about 2 nm, and may be 1 nm. In one embodiment, the thicknesses of the semiconductor material 330 is between about 10 nm and about 100 nm, and may be 50 nm.

Each of the semiconductor materials 330, 350 can have the same stoichiometric and/or atomic compositions or different stoichiometric and/or atomic compositions. In one embodiment, at least one of the electronic switching semiconductor materials 330, 350 is GaSb. In another embodiment, each of the electronic switching semiconductor materials 330, 350 is GaSb. In one embodiment the material 340 is silicon dioxide. The third/middle electrode 370 is a conductive material and can be the same material as either the first or second electrodes 313, 312.

Alternatively, one or more of materials 330, 350 can be a chalcogenide material, such as GST, gallium-antimony-tin, gallium-antimony-tin-germanium, germanium-tellurium, among others. Material 340 can be a dielectric material, such as a high dielectric constant material, an oxide (e.g., silicon dioxide), among others.

The embodiments described in connection with FIGS. 2A-2H provide memory cell structures that enable an access-transistor-free memory device 500 (FIG. 5) with improved data retention. In addition, where the electronic switching semiconductor materials 330, 350 (FIGS. 2A-2F) are selected to have a crystallization temperature greater than the temperatures used during various processing steps that the material 330 is to be exposed to, the need for circuitry to reset the materials 330, 350 from a crystalline state to an amorphous state is eliminated.

Figure 3A:
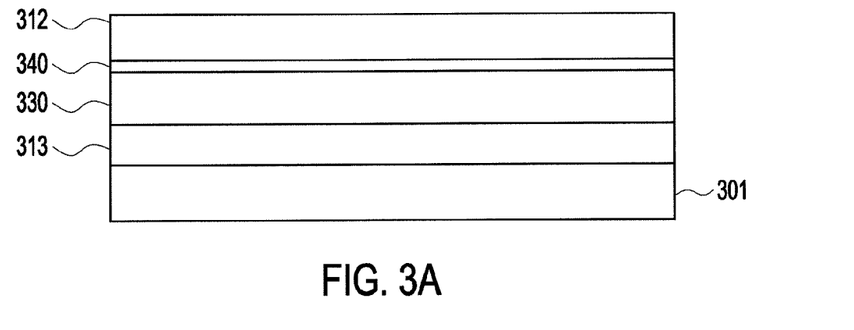
FIG. 3A-3B depicts the formation of a memory cell according to an embodiment.
Figure 3B:
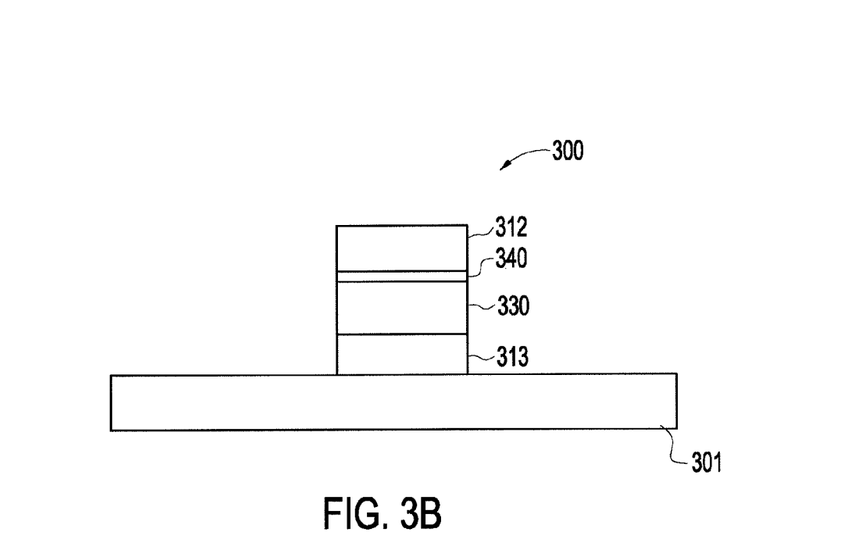

FIGS. 3A and 3B illustrate the formation of the memory cell 300 depicted in FIG. 2A. While the formation of a single memory cell 300 is shown, it should be understood that a plurality of memory cells 300 can be formed simultaneously in a similar manner.

As shown in FIG. 3A, the memory cell 300 can be formed on a substrate 301, such as an insulating material. A layer of conductive material 313 is formed over the substrate 301. An electronic switching semiconductor material 330 is formed over the conductive material 313. Material 340, having a higher band gap that semiconductor material 330 is formed over the semiconductor material 330; and a second layer of conductive material 312 is formed over the material 340.

Each of the materials 313, 330, 340, 312 can be formed by any suitable technique. The conductive materials 313, 312 can be any suitable thickness and can be any suitable conductive material, for example tungsten, TiW, among others. In the illustrated embodiment, semiconductor material 330 is GaSb and formed to a thickness of about 50 nm; and the material 340 is a dielectric material, specifically, silicon dioxide and is formed having a thickness of about 1 nm.

As shown in FIG. 3B, the materials 313, 330, 340, 312 are patterned and etched by known techniques to form memory cell 300 as a stack of the materials 313, 330, 340, 312. The conductive materials 313, 312 serve as the first and second electrodes 313, 312.

The memory cells 330 depicted in FIGS. 2C-2G can be formed in a similar manner as described above in connection with FIGS. 3A and 313, except that materials would be formed in a different order and/or additional layers of materials would be formed between the first and second conductive materials 313, 312 prior to etching the materials as shown in FIG. 3B.

Figure 4A:
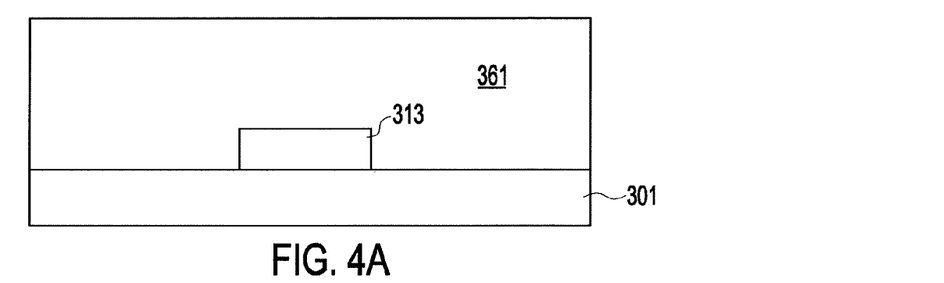
FIGS. 4A-4E depicts the formation of a memory cell according to an embodiment.

FIGS. 4A-4E illustrate the formation of the memory cell 300 shown in FIG. 2B. As shown in FIG. 4A, the memory cell 300 can be formed on a substrate 301, such as an insulating material. A first electrode 313 is formed over the substrate 301. The first electrode 313 can be formed by known techniques and can be formed of any suitable conductive material, for example tungsten, TiW, among others. A first dielectric material 361 is formed over the substrate 301 and first electrode 313.

Figure 4B:
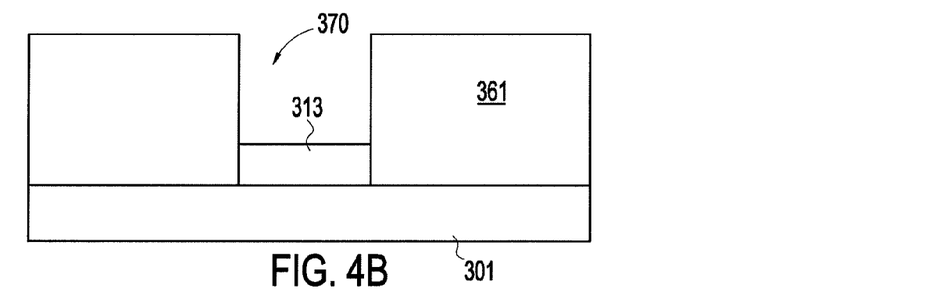

Referring to FIG. 4B, an opening 370 is formed in the first dielectric material 361 to expose a surface of the first electrode 313.

Figure 4C:
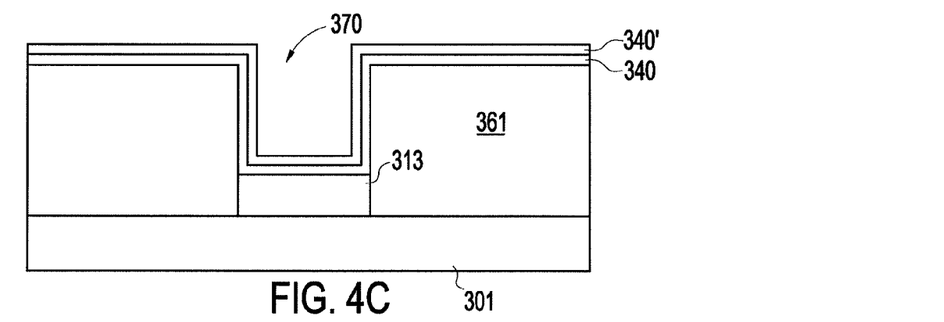

As depicted in FIG. 4C, first and second materials 340, 340', each having a band gap greater than the band gap of the electronic switching semiconductor material 330 (FIG. 4D), are formed over the first dielectric material 361, and on the surface of the first electrode 313 and on sidewalls of the opening 370. In the illustrated embodiment, the first and second materials 340, 340' are a dielectric material, e.g., silicon dioxide and have a thickness of about 1 nm. While materials 340, 340' are, for example, a same material, but they could be different from one another.

Figure 4D:
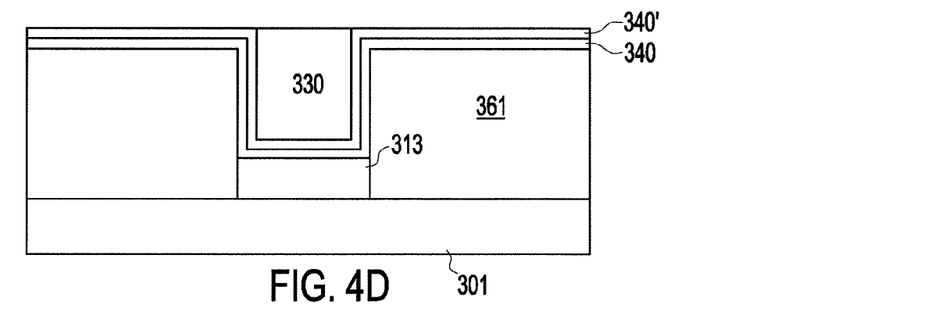

The opening 370 is filled with the electronic switching semiconductor material 330, as shown in FIG. 4D. In the illustrated embodiment, the semiconductor material 330 is GaSb and has a thickness of about 50 nm.

Figure 4E:
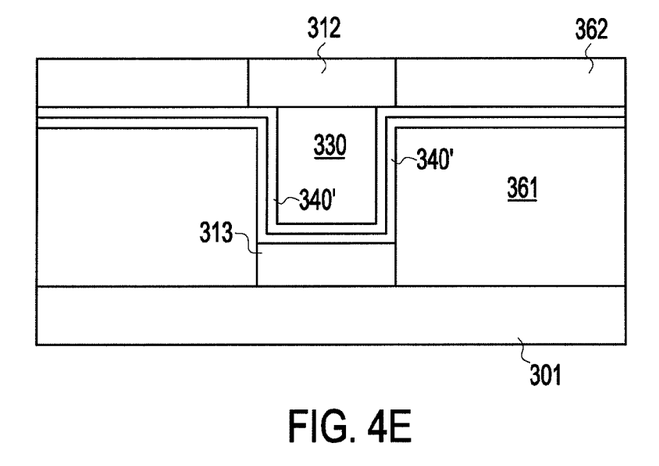

A second dielectric material 362 and second electrode 312 are formed over the semiconductor material 330 and first dielectric material 361 by known techniques, as shown in FIG. 4E. The second electrode is formed in contact with the semiconductor material 330 and can be formed of any suitable conductive material, for example tungsten, TiW, among others.

As described above, the FIG. 2B memory cell 300 can be formed without etching the material 340, 340' or the semiconductor material 330. Due to the scale on which the memory cells 300 are formed, there can be edge damage caused by etching. Since the structure of the FIG. 2B memory cell 300 can be formed without etching the material 340, 340' or the semiconductor material 330, edge damage can be avoided.

FIG. 5A depicts a memory device 500, including a memory array 502. The memory array 502 includes a plurality of memory cells 300 according to one or more of the embodiments shown in FIGS. 2A-2G. As shown in FIG. 5, the array 502 is an access transistor free array. The array 502 has a cross point architecture, such that there is a memory element at the intersection of each word line 540 with each bit line 541. Voltage is applied to the bit lines 541 and word lines 540 via bit line transistors 521 and word line transistors 520, respectively. The memory cells 300 of the array 502 can be programmed and read as described in Yi-Chou Chen et al., "An Access-Transistor-Free (0T/1R) Non-Volatile Resistance Random Access Memory (RRAM) Using a Novel Threshold Switching, Self-Rectifying Chalcogenide Device," IEEE International Electron Devices Meeting 2003.

Optionally, the device 500 can include circuitry 504 for supplying a current to the memory cell 300 and material 330 to reset the material 330 to an amorphous state.

Figure 5B:
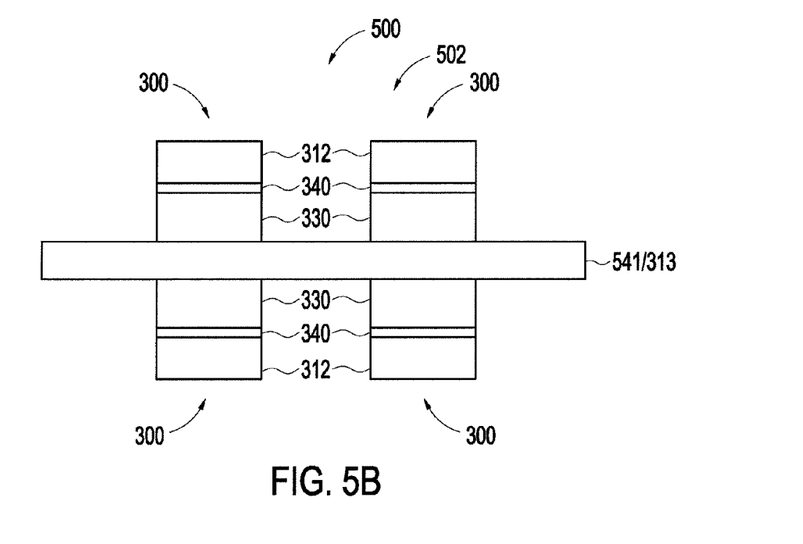
FIG. 5B is a block diagram of a portion of a memory device according to an embodiment.

FIG. 5B depicts a portion of a memory device 500 including a memory array 502 according to another embodiment. The array 502 includes a plurality of memory elements 300 sharing a common bit line 541. In the FIG. 5B embodiment two memory elements 300 are vertically stacked, with the common bit line 541 serving as a first electrode 313. In an alternative embodiment, the second electrode 312 could serve as the bit line 514. In the illustrated embodiment, memory cells 300 are depicted as shown in FIG. 2A, but the memory elements could instead be configured as shown in any of FIGS. 2C-2G.

Figure 6:
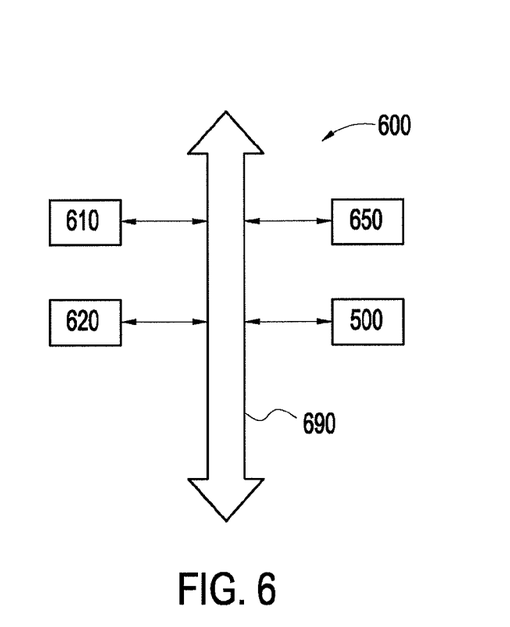
FIG. 6 is a block diagram of a processor system according to an embodiment.

It should be appreciated that the device 500 may be fabricated as part of an integrated circuit. The corresponding integrated circuits may be utilized in a processor system. For example, FIG. 6 illustrates a simplified processor system 600, which includes the memory device 500 that includes array 502. A processor system, such as a computer system, generally comprises a central processing unit (CPU) 610, such as a microprocessor, a digital signal processor, or other programmable digital logic devices, which communicates with an input/output (I/O) device 620 over a bus 690. The memory device 500 communicates with the CPU 610 over bus 690 typically through a memory controller.

In the case of a computer system, the processor system 600 may include peripheral devices such as removable media devices 650 (e.g., CD-ROM drive or DVD drive) which communicate with CPU 610 over the bus 690. Memory device 602 can be constructed as an integrated circuit, which includes one or more phase change memory devices. If desired, the memory device 500 may be combined with the processor, for example CPU 610, as a single integrated circuit.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A memory device comprising:
at least one memory cell comprising:
first and second electrodes;
a first semiconductor material between the first and second electrodes, the first semiconductor material being amorphous, capable of electronic switching and having a first band gap;
at least one portion of a material having a second band gap in contact with the first semiconductor material and between the second electrode and first semiconductor material such that the first semiconductor material is not in direct contact with the second electrode, the second band gap being greater than the first band gap;
the memory device configured such that during operation of the memory device to retain data, the first semiconductor material remains amorphous.

2. The memory device of claim 1, wherein the semiconductor material is gallium antimide.

3. The memory device of claim 1, wherein the semiconductor material is a chalcogenide material.

4. The memory device of claim 1, wherein the material is a dielectric material.

5. The memory device of claim 1, wherein the material is an oxide material.

6. The memory device of claim 1, wherein the material is silicon dioxide.

7. The memory device of claim 1, wherein the first semiconductor material has a thickness of about 50 nm.

8. The memory device of claim 1, wherein the first semiconductor material has a thickness between about 10 nm and about 100 nm.

9. The memory device of claim 1, wherein the material has a thickness of about 1 nm.

10. The memory device of claim 1, wherein the material has a thickness between about 0.5 nm and about 2 nm.

11. A memory cell comprising:
first and second electrodes;
a first semiconductor material between the first and second electrodes, the first semiconductor material being amorphous, capable of electronic switching and having a first band gap;
at least one portion of a material having a second band gap in contact with the first semiconductor material, the second band gap being greater than the first band gap; and
at least one heterogeneous structure between the first and second electrodes, the at least one heterogeneous structure comprising:
a plurality of portions of the material, and
at least one portion of a second semiconductor material, the second semiconductor material being amorphous, capable of electronic switching and having a third band gap less than the second band gap, the plurality of portions of the material alternating with the at least one second semiconductor material.

12. The memory cell of claim 11, wherein the first semiconductor material comprises a same material as the second semiconductor material.

13. The memory cell of claim 11, wherein the first semiconductor material is in contact with the first electrode and a portion of the material within the at least one heterogeneous structure is in contact with the second electrode.

14. The memory cell of claim 11, further comprising:
a third semiconductor material, the third semiconductor material being amorphous, capable of electronic switching and having a fourth band gap less than the second band gap; and
first and second heterogeneous structures, wherein the first semiconductor material is in contact with the first electrode, the first heterogeneous structure is between the first and third semiconductor materials and a portion of the material within the second heterogeneous structure is in contact with the second electrode.

15. The memory cell of claim 11, further comprising a third semiconductor material, the third semiconductor material being amorphous, capable of electronic switching and having a fourth band gap less than the second band gap, wherein the first semiconductor material is in contact with the first electrode and the third semiconductor material is in contact with the second electrode.

16. The memory cell of claim 11, further comprising:
a third semiconductor material, the third semiconductor material being amorphous, capable of electronic switching and having a fourth band gap less than the second band gap;

a fourth semiconductor material, the fourth semiconductor material being amorphous, capable of electronic switching and having a fifth band gap less than the second band gap; and first and second heterogeneous structures, wherein the first semiconductor material is in contact with the first electrode, the first heterogeneous structure is between the first and third semiconductor materials, the fourth semiconductor material is in contact with the second electrode, and the second heterogeneous structure is between the third and fourth semiconductor materials.

17. The memory cell of claim 11, further comprising a third electrode between the heterogeneous structure and the first semiconductor material.

18. A memory device comprising:
at least one memory element comprising:
first and second electrodes;
a first portion of gallium antimide between the first and second electrodes; and
a first dielectric material in contact with the gallium antimide and between the second electrode and gallium antimide such that the gallium antimide is not in direct contact with the second electrode, the first dielectric material having a band gap greater than a band gap of gallium antimide;
the memory device configured such that during operation of the memory device to retain data, the first portion of gallium antimide remains amorphous.

19. The memory device of claim 18, wherein the first dielectric material is silicon dioxide.

20. The memory device of claim 18, wherein the first dielectric material has a thickness between about 0.5 nm and about 2 nm.

21. The memory device of claim 18, wherein the first dielectric material is on sidewalls of an opening within a second dielectric material and in contact with a surface of the first electrode, and wherein the first portion of galluim antimide is within the opening.

22. A memory cell comprising:
first and second electrodes;
a first semiconductor material between the first and second electrodes, the first semiconductor material being amorphous, capable of electronic switching and having a first band gap; and
a heterogeneous structure between the first and second electrodes, the at least one heterogeneous structure comprising:
a plurality of portions of a dielectric material having a second band gap, the second band gap being greater than the first band gap, and
at least one portion of a second semiconductor material, the second semiconductor material being amorphous, capable of electronic switching and having a third band gap less than the second band gap, the plurality of portions of the dielectric material alternating with the at least one portion of the second semiconductor material.

23. The memory cell of claim 22, wherein the first dielectric material is an oxide material.

24. The memory cell of claim 22, wherein the first dielectric material is silicon dioxide.

25. The memory cell of claim 22, wherein the first and second semiconductor materials are gallium antimide.

26. The memory cell of claim 22, wherein the first and second semiconductor materials are a chalcogenide material.

27. The memory cell of claim 22, wherein each portion of the first dielectric material and each portion of the second semiconductor material have a thickness between about 0.5 nm and about 2 nm.

28. The memory cell of claim 22, wherein each portion of the first dielectric material and each portion of the second semiconductor material have a thickness of about 1 nm.

29. The memory cell of claim 22, wherein the heterogeneous structure comprises two portions of the dielectric material and one portion of the second semiconductor material.

30. The memory cell of claim 22, wherein the heterogeneous structure comprises five portions of the dielectric material and four portions of the second semiconductor material.

31. A method of forming a memory device, the method comprising:
forming at least one memory cell, comprising:
forming a first electrode;
forming a second electrode;
forming a semiconductor material between the first and second electrodes, the semiconductor material capable of electronic switching and having a first band gap; and
forming a material in contact with the semiconductor material and between the second electrode and first semiconductor material such that the first semiconductor material is not in direct contact with the second electrode, the material having a second band gap, the second band gap being greater than the first band gap; and
configuring the memory device such that data is retained via the modulation of the electronic switching threshold voltage.

32. The method of claim 31, wherein the semiconductor material is a chalcogenide material.

33. The method of claim 31, wherein the material is a dielectric material.

34. The method of claim 31, wherein the material is an oxide material.

35. The method of claim 31, wherein the first semiconductor material is formed having a thickness between about 10 nm and about 100 nm.

36. The method of claim 31, wherein the first semiconductor material is formed having a thickness of about 50 nm.

37. The method of claim 31, wherein the material is formed having a thickness between about 0.5 nm and about 2 nm.

38. The method of claim 31, wherein the material is formed having a thickness of about 1 nm.

39. A method of forming a memory cell, the method comprising:
forming a first electrode;
forming a second electrode;
forming a semiconductor material between the first and second electrodes, the semiconductor material capable of electronic switching and having a first band gap;
forming a material in contact with the semiconductor material, the material having a second band gap, the second band gap being greater than the first band gap; and
forming at least one heterogeneous structure between the first and second electrodes, the forming the at least one heterogeneous structure comprising:
forming a plurality of portions of the material, and
forming at least one portion of a second semiconductor material, the second semiconductor material capable of electronic switching and having a third band gap less than the second band gap, the plurality of portions of the material being formed to alternate with the at least one second semiconductor material.

40. The method of claim 39, wherein each portion of the material is formed having a thickness of about 1 nm and each portion of the second semiconductor material is formed having a thickness between about 0.5 nm and about 2 nm.

41. The method of claim 39, further comprising forming a third electrode located between the at least one heterogeneous structure and the semiconductor material.

42. A method of forming a memory device, the method comprising:
forming at least one memory cell, comprising:
forming a first electrode;
forming a first dielectric material over the first electrode;
forming an opening within the first dielectric material to expose a surface of the first electrode;
forming a second dielectric material on sidewalls of the opening and in contact with the surface of the first electrode;
forming a semiconductor material within the opening and over the second dielectric material, the semiconductor material capable of electronic switching and having a first band gap, the second dielectric material having a second band gap greater than the first band gap; and
forming a second electrode in contact with the semiconductor material; and
configuring the memory cell such that during operation of the memory cell to retain data, the first semiconductor material remains amorphous.

43. The method of claim 42, wherein the semiconductor material is gallium antimide.

44. The method of claim 42, wherein the material is silicon dioxide.

45. The method of claim 42, wherein the first semiconductor material has a thickness between about 10 nm and about 100 nm.

46. The method of claim 42, wherein the material has a thickness between about 0.5 nm and about 2 nm.

47. A memory device comprising:
an array of memory cells, each memory cell comprising:
first and second electrodes;
a first semiconductor material capable of electronic switching being between the first and second electrodes and having a first band gap; and
a first material in contact with the semiconductor material and having a second band gap and between the second electrode and first semiconductor material such that the first semiconductor material is not in direct contact with the second electrode, the second band gap greater than the first band gap; and
the memory device configured such that data is retained via the modulation of the electronic switching threshold voltage.

48. The device of claim 47, wherein the array of memory cells is configured having a cross point architecture.

49. The device of claim 47, further comprising circuitry for applying a voltage to the memory cells to change the semiconductor material from a crystalline state to an amorphous state.

50. A memory device comprising:
an array of memory cells, each memory cell comprising:
first and second electrodes;
a first semiconductor material capable of electronic switching being between the first and second electrodes and having a first band gap;
a first material in contact with the semiconductor material and having a second band gap, the second band gap greater than the first band gap; and
at least one heterogeneous structure between the first and second electrodes, the at least one heterogeneous structure comprising:
a plurality of portions of the material, and
at least one portion of a second semiconductor material, the second semiconductor material being amorphous, capable of electronic switching and having a third band gap less than the second band gap, the plurality of portions of the material alternating with the at least one second semiconductor material.

51. The device of claim 47, wherein the material is on sidewalls of an opening within a dielectric material and in contact with a surface of the first electrode, and wherein the first portion of galluim antimide is within the opening.

52. The device of claim 47, wherein the semiconductor material is gallium antimide.

53. The device of claim 47, wherein the semiconductor material is a chalcogenide material.

54. The device of claim 47, wherein the material is a dielectric material.

55. The device of claim 54, wherein the material is an oxide material.

* * * * *

UNITED STATES PATENT AND TRADEMARK OFFICE
CERTIFICATE OF CORRECTION

PATENT NO. : 8,847,195 B2  
APPLICATION NO. : 12/647020  
DATED : September 30, 2014  
INVENTOR(S) : Chandra Mouli et al.

Page 1 of 1

It is certified that error appears in the above-identified patent and that said Letters Patent is hereby corrected as shown below:

In the Claims,

In column 11, line 39, in Claim 21, delete "galluim" and insert -- gallium --, therefor.
In column 14, line 36, in Claim 51, delete "galluim" and insert -- gallium --, therefor.

Signed and Sealed this
Twenty-third Day of December, 2014

Michelle K. Lee
*Deputy Director of the United States Patent and Trademark Office*